US 6,492,706 B1

(12) United States Patent
Rouse

(10) Patent No.: US 6,492,706 B1
(45) Date of Patent: Dec. 10, 2002

(54) PROGRAMMABLE PIN FLAG

(75) Inventor: Mark W. Rouse, Snohomish, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/736,648

(22) Filed: Dec. 13, 2000

(51) Int. Cl.$^7$ .............................................. H01L 29/00
(52) U.S. Cl. ...................................... 257/529; 257/530
(58) Field of Search .................................. 257/529, 530

(56) References Cited

U.S. PATENT DOCUMENTS

| | | | |
|---|---|---|---|
| 3,717,852 A | * 2/1973 | Abbas et al. | |
| 4,382,289 A | * 5/1983 | Saitoh | |
| 4,419,747 A | 12/1983 | Jordan | 365/201 |
| 4,480,199 A | 10/1984 | Varshney et al. | 307/303 |
| 4,510,673 A | 4/1985 | Shils et al. | 29/574 |
| 4,550,289 A | 10/1985 | Kabashima et al. | 324/158 R |
| 4,569,120 A | * 2/1986 | Stacy et al. | |
| 4,692,787 A | * 9/1987 | Possley et al. | |
| 4,698,589 A | 10/1987 | Blankenship et al. | 324/158 R |
| 4,714,876 A | 12/1987 | Gay et al. | 324/73 R |
| 4,743,821 A | 5/1988 | Hall | 318/599 |
| 4,816,757 A | 3/1989 | Hutchins | 324/158 R |
| 4,823,181 A | * 4/1989 | Mohsen et al. | |
| 4,853,628 A | 8/1989 | Gouldsberry et al. | 324/158 R |
| 4,862,136 A | 8/1989 | Birkner | 338/195 |
| 4,881,114 A | * 11/1989 | Mohsen et al. | |
| 4,970,454 A | 11/1990 | Stambaugh et al. | 324/73.1 |
| 5,051,691 A | 9/1991 | Wang | 324/158 R |
| 5,298,784 A | * 3/1994 | Gambino et al. | 257/529 |
| 5,339,028 A | 8/1994 | Ovens et al. | 324/158.1 |
| 5,536,968 A | * 7/1996 | Crafts et al. | 257/529 |
| 5,642,307 A | 6/1997 | Jernigan | 365/103 |
| 5,646,879 A | * 7/1997 | Harshfield | 365/105 |
| 5,764,650 A | 6/1998 | Debenham | 371/5.1 |
| 5,844,298 A | * 12/1998 | Smith et al. | 257/530 |
| 5,895,443 A | 4/1999 | Gross, Jr. et al. | 702/120 |
| 5,927,512 A | 7/1999 | Beffa | 209/573 |
| 5,982,188 A | 11/1999 | Lysinger | 324/763 |
| 5,986,420 A | 11/1999 | Kato | 318/272 |
| 5,998,853 A | 12/1999 | Sugasawara | 257/529 |
| 6,018,686 A | 1/2000 | Orso et al. | 700/121 |
| 6,337,507 B1 | * 1/2002 | Bohr et al. | 257/529 |

* cited by examiner

Primary Examiner—Ngân V. Ngô
(74) Attorney, Agent, or Firm—Christopher P. Maiorana, P.C.

(57) ABSTRACT

An apparatus comprising a storage element coupled between a first and a second bond pad, the storage element having a physical characteristic that can be measured and altered. Data may be stored in the storage element by altering the physical characteristic.

20 Claims, 6 Drawing Sheets

PROGRAMMABLE PIN FLAG

FIELD OF THE INVENTION

The present invention relates to a method and/or architecture for storing flags generally and, more particularly, to a programmable pin flag.

BACKGROUND OF THE INVENTION

Information regarding semiconductor devices on a wafer such as test results, repair status, wafer location, and manufacture lot need to be available after the devices are assembled into integrated circuit packages. Devices without the information stored and readily accessible must be tested (or retested) after packaging to determine, for example, speed of operation or cause of failure. Information such as manufacturing lot or wafer location can not be determined after packaging. Conventional methods for storing device information on devices include (i) placing visible. markings on the device, (ii) adding memory cells and control circuitry for storing the information, and (iii) adding laser blown fuse circuits.

However, conventional approaches have one or more of the following disadvantages: (i) visible markings are destroyed or unreadable when the device is packaged, (ii) increased process expense and design complexity, (iii) added memory circuitry can require significant die area and overhead, and/or (iv) laser blown fuses require a laser as well as test circuitry on the test fixture.

It would be desirable to have an architecture and/or method for storing information at a device pin.

SUMMARY OF THE INVENTION

The present invention concerns an apparatus comprising a storage element coupled between a first and a second bond pad. The storage element having a physical characteristic that can be measured and altered. Data may be stored in the storage element by altering the physical characteristic.

The objects, features and advantages of the present invention include providing a programmable pin flag that may (i) be implemented with a simple wafer process, (ii) be implemented with a simple circuit, (iii) be programmed at sort and retrieved for class testing, (iv) share bond pads with standard circuitry, (v) have no effect on standard circuit operation, (vi) minimize program and retrieval times, (vii) allow easy data retrieval, (viii) use little die area, and/or (ix) have low fabrication cost.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
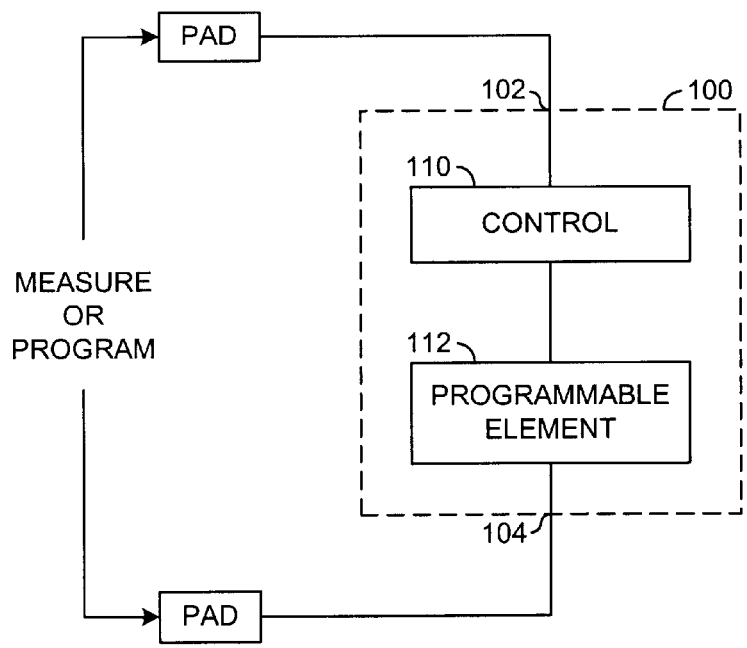
FIG. 1 is a block diagram of a preferred embodiment of the present invention.

Referring to FIG. 1, a block diagram of a circuit 100 illustrating a preferred embodiment of the present invention is shown. The circuit 100 may comprise a programmable storage element. The storage element may have a physical characteristic (e.g., electrical resistance) that may be altered in response to a signal (e.g., PROGRAM). Data may be stored in the circuit 100 by altering the physical characteristic to encode the data. The data may be subsequently retrieved by measuring the physical characteristic in response to a signal (e.g., MEASURE). The programming circuitry for altering the physical characteristic may be separate from (external to) the circuit 100 and/or an integrated circuit implementing the circuit 100. The programming circuitry may be incorporated into a semiconductor testing device. The circuit 100 may be implemented, in one example, as a programmable pin flag circuit.

The circuit 100 may have a terminal 102 and a terminal 104. The signals PROGRAM and MEASURE may be presented to the circuit 100 via the terminals 102 and 104. The terminal 104 may be connected to a supply voltage (e.g., VCC or VSS). When the terminal 104 is connected to a supply voltage, the signals PROGRAM and MEASURE are generally referenced to the respective supply voltage and presented to the terminal 102.

The circuit 100 may comprise, in one example, a circuit 110 and a device 112. The circuit 110 may be a control circuit. The device 112 may be a programmable storage element (e.g., a programmable pin flag). The signals PROGRAM and MEASURE may be presented between a first terminal of the circuit 110 and a first terminal of the device 112. The circuit 110 may have a second terminal that may be connected to a second terminal of the device 112. The device 112 may be an element with a programmable electrical characteristic. The first terminals of the circuit 110 and the device 112 may be connected to bond pads.

Figure 2:
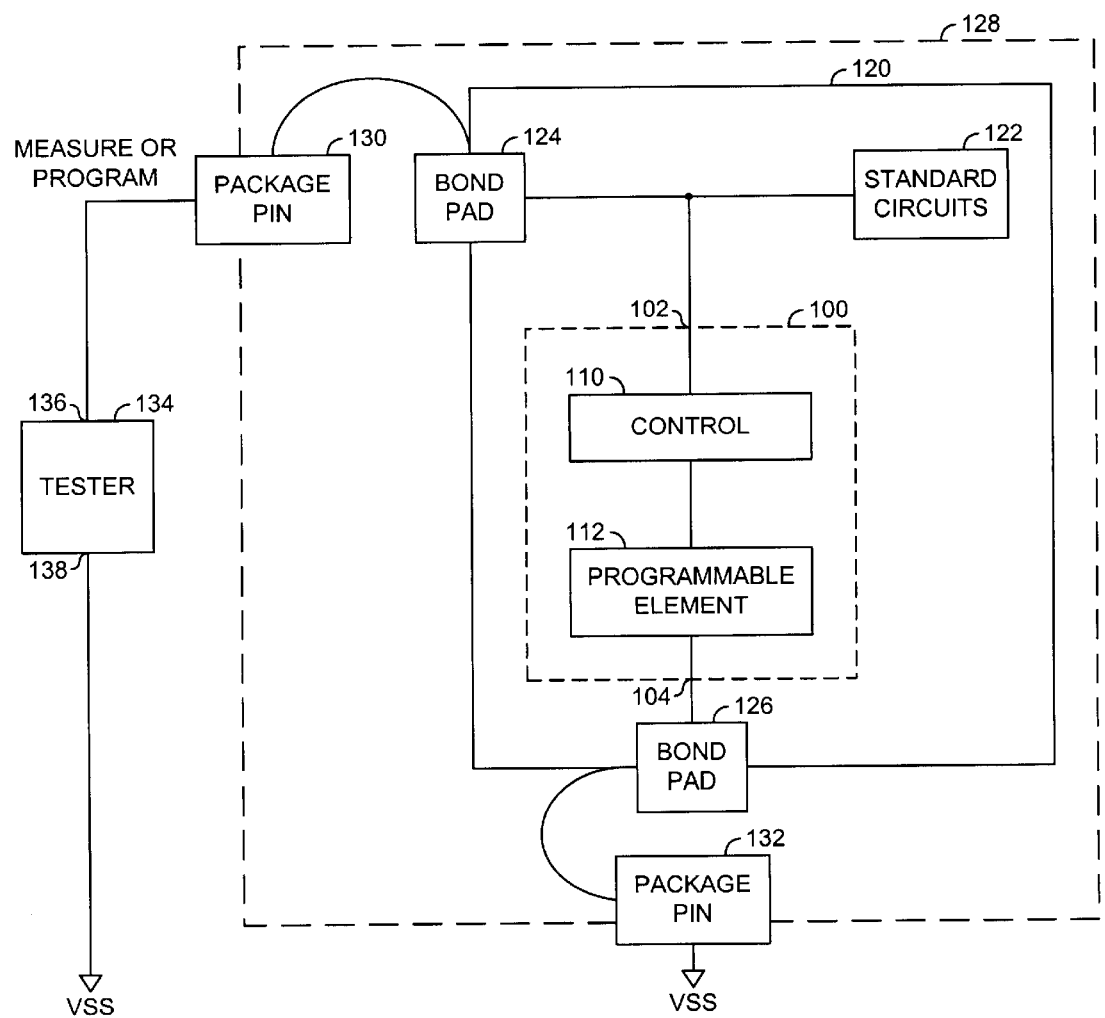
FIG. 2 is a block diagram illustrating an implementation of a preferred embodiment of the present invention.

Referring to FIG. 2, a block diagram illustrating the circuit 100 implemented in the context of an integrated circuit (chip) is shown. The circuit 100 may be implemented on a die 120 with other standard circuits 122. The terminal 102 of the circuit 100 may be connected to a bond pad 124. The terminal 104 of the circuit 100 may be connected to a bond pad 126. In one example, the standard circuits 122 may be connected to the bond pad 124. Alternatively, the standard circuits 122 may share the bond pad 126 as well. The die 120 may be mounted in a package 128. The package 128 may have a pin 130 and a pin 132. The bond pad 124 may be connected to the pin 130 and the bond pad 126 may be connected to the pin 132. In one example, the package pin 132 may be connected to a voltage supply ground (e.g., VSS). However, the package pin 132 may also be connected to a power supply voltage (e.g., VCC). A tester 134 may be used to test the operation of the circuits 122. The tester 134 may have an output 136 and an output 138. In one example, the output 136 of the tester 134 may be connected to the package pin 130 and the output 138 may be connected to the package pin 132. The tester 134 may be configured to present the signals PROGRAM and/or MEASURE at the outputs 136 and 138. In the case where the package pin 132 is connected to the ground potential VSS or the voltage supply VCC, the output 138 of the tester 134 may be connected to the ground potential VSS or the supply voltage VCC as well.

The tester 134 may, in one example, comprise a parametric measurement unit. However, any appropriate tester may be used. For example, the tester 134 may (i) apply voltage or current to a device under test and measure a resulting current or voltage, respectively, and/or (ii) measure signal timing. The tester 134 may comprise circuitry for programming and measuring the physical characteristic of the circuit 100. The tester 134 may be connected to the bond pads 124 and 126 using micro-contacts. Other appropriate connections between the tester 134 and the circuit 100 may be implemented to meet the design criteria of a particular application. When the circuit 100 is disabled or isolated, the standard circuits 122 may be enabled. The standard circuits 122 may be isolated from the bond pad 124 when the circuit 100 is enabled.

Figure 3:
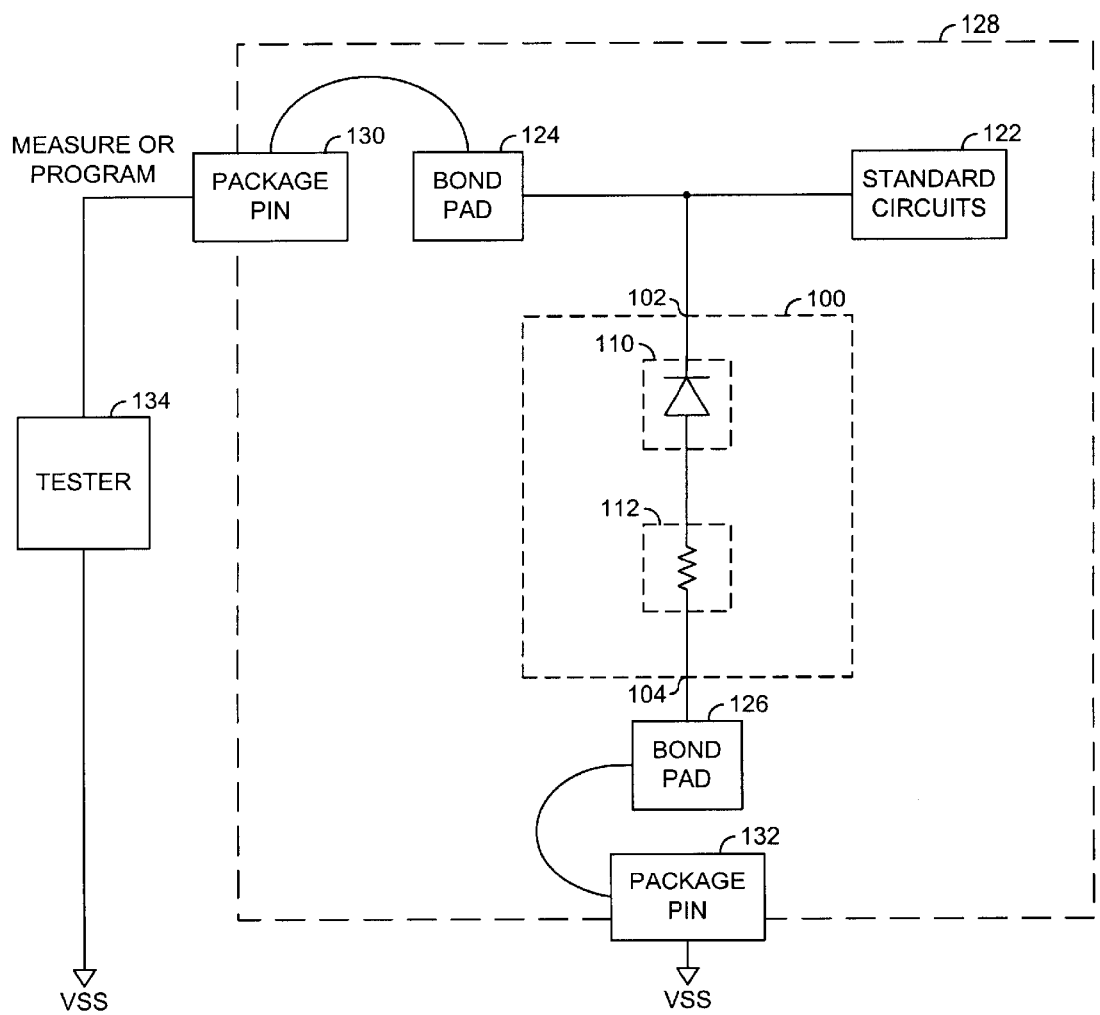
FIG. 3 is a detailed block diagram of a preferred embodiment of the present invention.

Referring to FIG. 3, a detailed diagram of the circuit 100 illustrating a preferred embodiment of the present invention is shown. The circuit 110 may be implemented as a diode (or a transistor or transistors configured as a diode). The device 112 may be implemented as a fuse. When the diode 110 is forward biased (e.g., during a test mode of the circuit 100), the element 112 is generally coupled to the bond pads 124 and 126 and may be programmed or measured. When the diode 110 is reverse biased (e.g., during normal or non-test operation), the element 112 is generally isolated from the bond pad 124. The circuit 100 generally does not affect the operation of the other circuitry 122 connected to the pad 124.

When the storage element 112 is implemented as a fuse, the programmable pin flag 100 may have a binary value (e.g., 1 or 0, fuse blown or intact, etc.) . Alternatively, the element 112 may be implemented as a resistive element with a resistance that is programmable in response to the signal PROGRAM. When the element 112 is implemented as a programmable resistance, stored data may be encoded by setting the element 112 to particular values of resistance.

Figure 4:
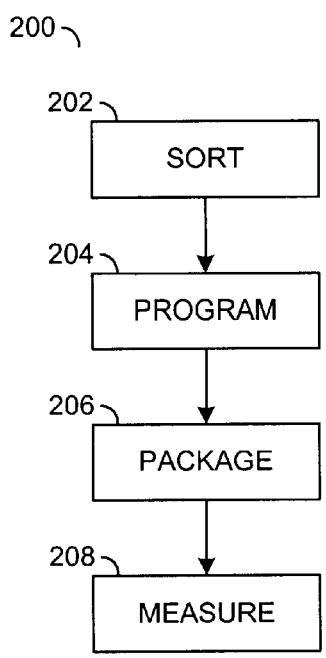
FIG. 4 is a flow diagram of a process of the present invention.

Referring to FIG. 4, a flow diagram 200 illustrating an example operation in accordance with the present invention is shown. Predetermined parameters (e.g., speed of operation, rework or repair status, manufacture lot, wafer location, etc.) may be used during a sorting phase of a production process for the integrated circuit 120 (e.g., step 202).

Information resulting from the sorting step may be programmed into the circuit 100 by altering the physical characteristic of the circuit 100 using the tester 134 (e.g., step 204). When the circuit 110 is enabled, the signal PROGRAM may be applied to cause the element 112 to change to a desired value. In one example, the element 112 may be a fuse. When the signal PROGRAM is a sufficiently high current, the fuse will generally blow and the circuit 112 will become an open circuit (e.g., a very high resistance). In another example, the circuit 112 may be an anti-fuse. When the signal PROGRAM is a sufficiently high current, the anti-fuse may fuse and the circuit 112 may become a short circuit (e.g., a very low resistance). In another example, the circuit 112 may be an element with an electrical characteristic (e.g., resistance, threshold voltage, capacitance, etc.) that may change value in response to the signal PROGRAM. Implementation of the circuit 100 with the circuit 112 configured to change to a range of values may enable the circuit 100 to be programmed with a number of pin flag values.

Fabrication of the circuit 120 may include packaging into an appropriate integrated circuit package 128 such as a single-inline-pin, a dual-inline-pin package, or other appropriate package for meeting the design criteria of a particular application (e.g., step 206). Subsequent to packaging, the information programmed into the circuit 100 may be retrieved by enabling the circuit 110 and measuring the value of the element 112 (e.g., step 208). In one example, the measuring step may be performed during class testing. The measuring step may be performed using the same or a different tester than was used in the programming step 204.

Figure 5:
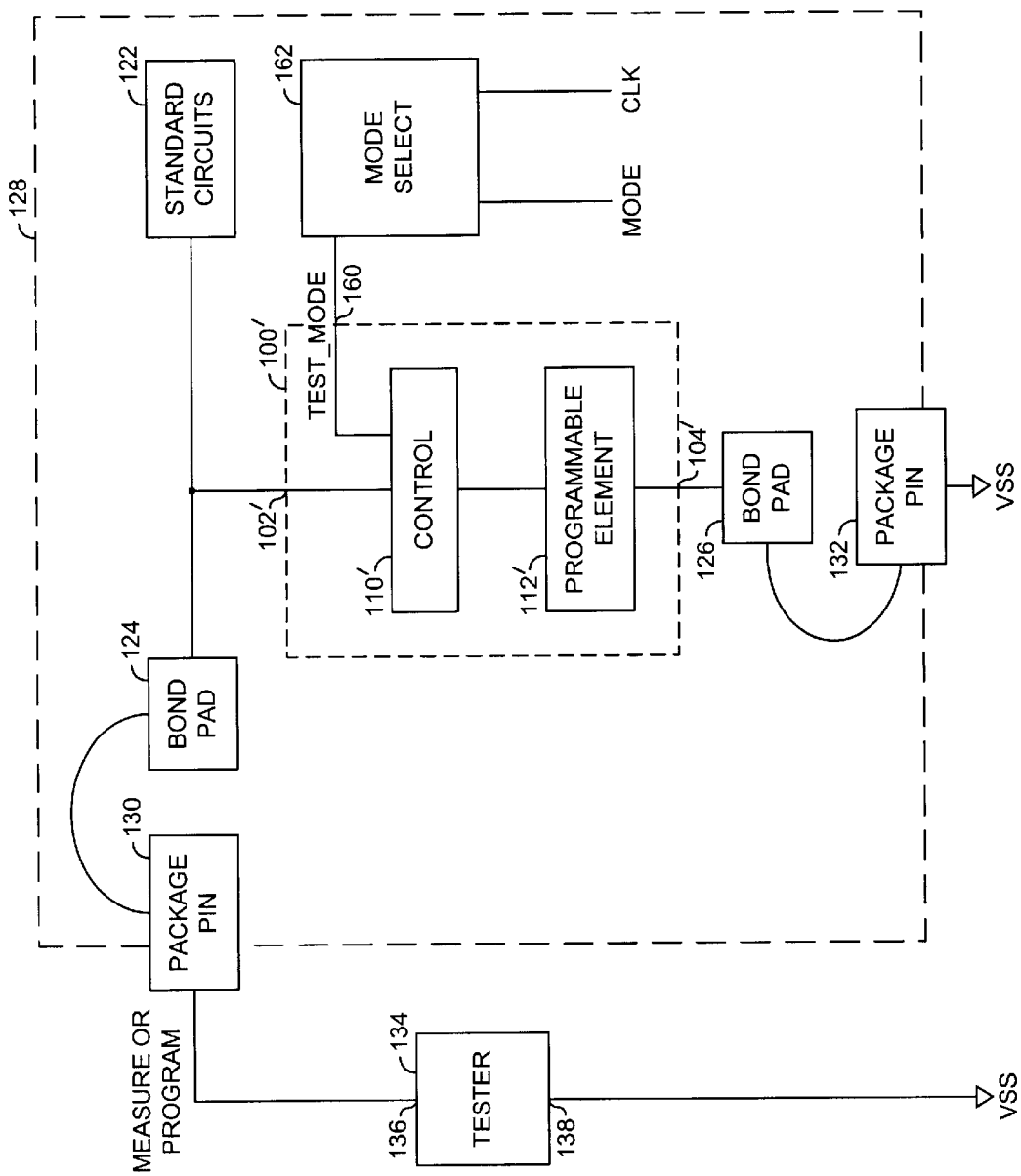
FIG. 5 is a block diagram of an alternative embodiment of the present invention.

Referring to FIG. 5, a diagram of a circuit 100' illustrating an alternative embodiment of the present invention is shown. The circuit 100' may be implemented similarly to the circuit 100 except that the circuit 100' may have an input 160 that may receive a signal (e.g., TEST_MODE). The signal TEST_MODE may be generated by a mode select circuit 162 in response to a signal (e.g., MODE) and a signal (e.g., CLK). The signal MODE may be a mode selection signal. The signal CLK may be a clock signal. The circuit 100' may have a program/measure (test) mode and a normal mode. The signal TEST_MODE may be used to enable the programming or measuring of the physical characteristic (e.g., the test mode) of the circuit 100'.

The circuit 100' may comprise a circuit 110' and a device 112'. The circuit 110' may be connected similarly to the circuit 110. However, the circuit 110' may have a control input that may receive the signal TEST_MODE. The circuit 110' may be configured to couple or uncouple the storage element 112' to the bonding pad 124 in response to the signal TEST_MODE. The storage element 112' may be implemented' similarly to the storage element 112.

Figure 6:
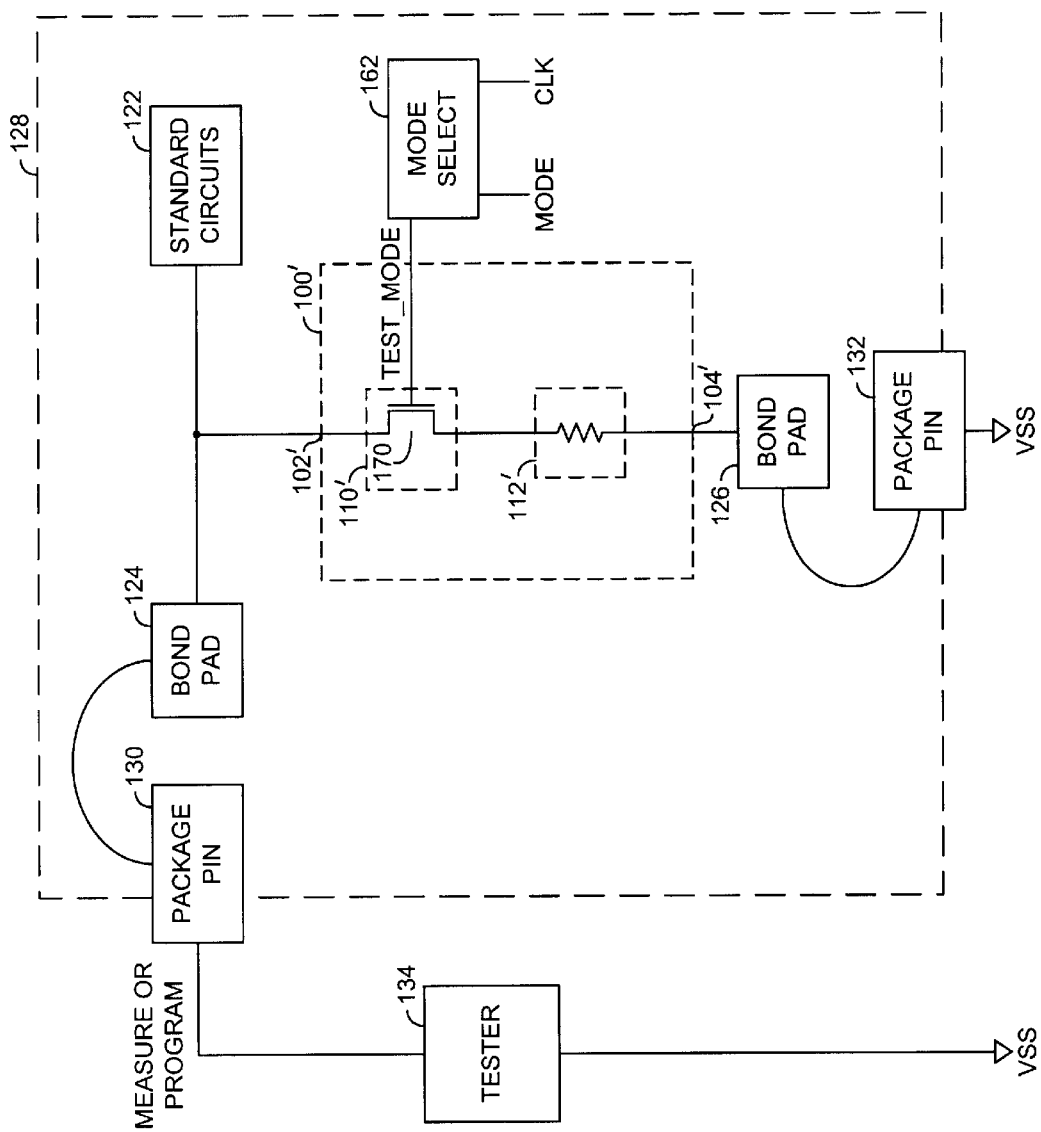
FIG. 6 is a more detailed block diagram of an embodiment of FIG. 5.

Referring to FIG. 6, a detailed block diagram of the circuit 100' is shown. The circuit 110' may comprise a transistor 170. In one example, the transistor 170 may be implemented as one or more NMOS transistors. However, other types and polarities of transistors may. be implemented to meet the design criteria of a particular application. For example, the transistor 170 may be implemented using PMOS, NPN, PNP, FET or any other appropriate transistors. The transistor 170 may have a first terminal that may receive the signal PROGRAM or the signal MEASURE, a second terminal that may receive the signal TEST_MODE, and a third terminal that may be connected to a terminal of the element 112'. While the circuit 110' has been described as a transistor, other switching devices may be implemented to meet the design criteria of a particular application. The control circuit 110' may normally be in an "off" (or disabled) state. The control circuit 110' may be turned "on" (or enabled) in response to the signal TEST_MODE. The circuit 162 may be a mode select and/or mode sequencer circuit. In one example, the circuit 162 may be implemented as a state machine.

Figure 7:
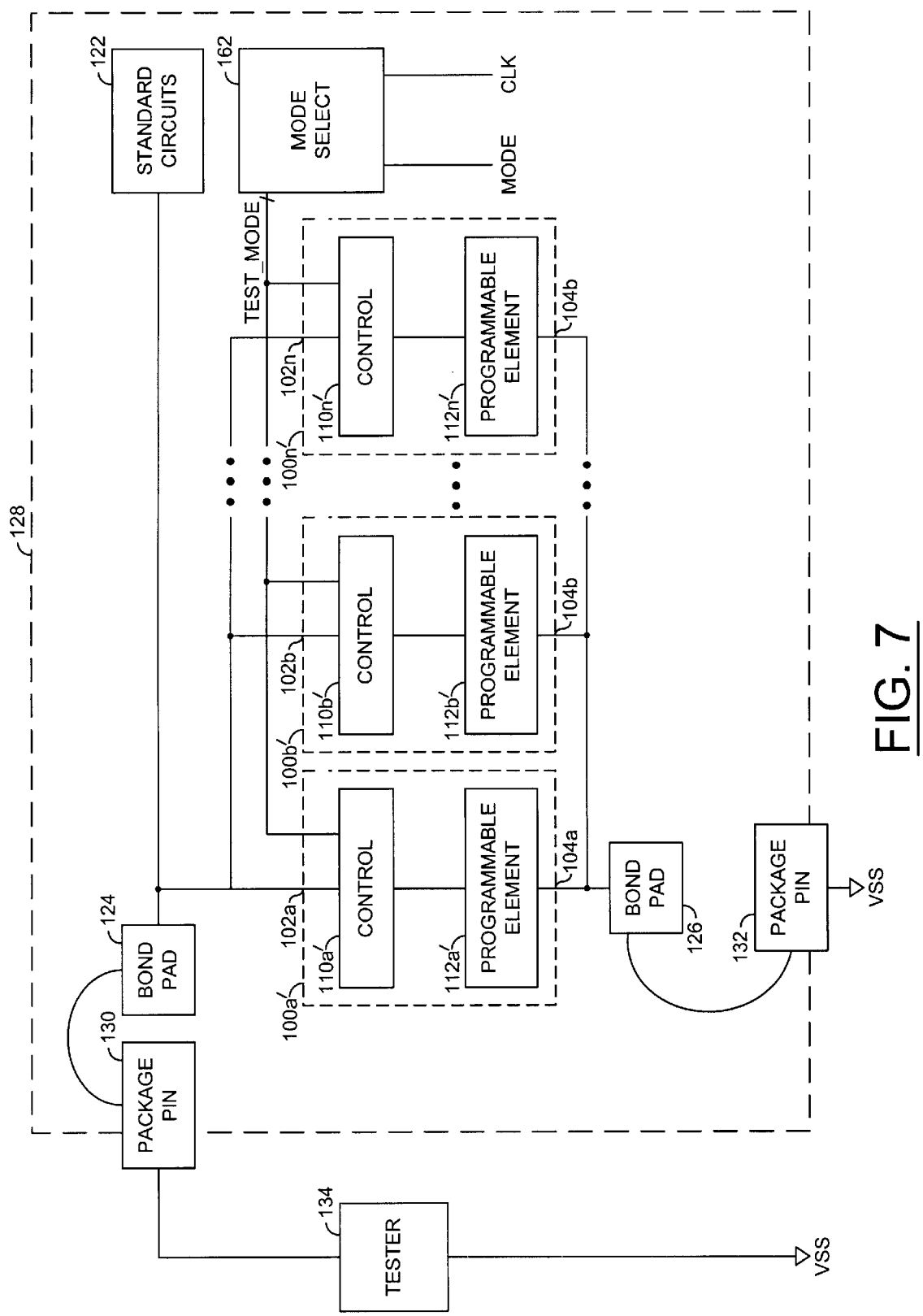
FIG. 7 is a block diagram of another alternative embodiment of the present invention.

Referring to FIG. 7, a block diagram illustrating another alternative embodiment of the present invention is shown. In one example, a number of storage elements 100'a–100'n may be connected between the bond pads 124 and 126. The mode select circuit 162 may be configured to generate the signal TEST_MODE as a multi-bit signal. For example, the signal TEST_MODE may be generated having N-bits, where N is an integer. Each of the N-bits may be used to control a respective one of the circuits 110'a–110'n. The circuits 110'a–110'n may share the bond pad 124 and the package pin 130. The circuits 112'a–112'n may share the bond pad 126 and the package pin 132. The circuit 162 may be configured to select the circuits 100'a–100'n in sequence, simultaneously, or in a random order for programming and/or measuring the data stored in the circuits 100'a–100'n.

In an alternative embodiment (not shown), groups of one or more of the circuits 100'a–100'n may each be connected to a separate bond pad. The use of separate bond pads may allow parallel programming and retrieval of stored data.

While the programming and measuring processes have been discussed using the t,ester circuit 134, other suitable programming and/or measuring equipment may be implemented for programming and/or measuring the circuit 100. to meet the design criteria of a particular application.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of,a particular implementation. Similarly, the package pin 124 has been described as receiving the signals PROGRAM and MEASURE and the package pin 126 has been described as connected to the ground potential VSS. However, the connections may be reversed (e.g., the package pin 124 may be connected to the ground potential VSS and the package pin 126 may receive the signals PROGRAM and MEASURE). In another example, instead of the circuit 100 being connected to the ground potential VSS, the circuit 100 may be connected to a supply voltage VCC or a supply voltage VHH.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a storage element comprising a first circuit and a second circuit coupled between a first and a second bond pad, said storage element having a physical characteristic that can be measured and altered, wherein (i) data is stored in said storage element by altering said physical characteristic and (ii) said second circuit is configured to couple said first circuit to said first bond pad in response to an enable signal; and
   other circuitry (i) connected to said first bond pad and (ii) isolated from said first bond pad when said first circuit is coupled to said first bond pad.

2. The apparatus according to claim 1, wherein said physical characteristic comprises an electrical characteristic.

3. The apparatus according to claim 1, wherein said storage element has a physical characteristic selected from the group consisting of electrical resistance, threshold voltage and capacitance.

4. The apparatus according to claim 1, wherein said physical characteristic is altered in response to a programming input presented to said first and/or second bond pads.

5. The apparatus according to claim 4, wherein said other circuitry is fabricated on the same chip as the storage element.

6. The apparatus according to claim 1, wherein said first circuit comprises a device having said physical characteristic.

7. The apparatus according to claim 1, wherein said apparatus further comprises a third circuit configured to generate one or more of said enable signals in response to one or more select signals.

8. The apparatus according to claim 6, wherein said apparatus comprises a plurality of said storage elements.

9. The apparatus according to claim 7, wherein said one or more enable signals are further generated in response to a clock signal.

10. The apparatus according to claim 7, wherein said second circuit comprises a switch circuit configured to couple said first circuit to said bond pads in response to said enable signal.

11. The apparatus according to claim 6, wherein said first circuit comprises a fuse.

12. The apparatus according to claim 6, wherein said first circuit comprises an anti-fuse.

13. The apparatus according to claim 6, wherein (i) said first circuit comprises an element configured to change said physical characteristic in response to a programming input and (ii) said physical characteristic is selected from the group consisting of electrical resistance, threshold voltage and capacitance.

14. The apparatus according to claim 7, wherein said third circuit further comprises a state machine configured to generate said one or more enable signals sequentially, randomly, or simultaneously.

15. The apparatus according to claim 8, wherein said plurality of first circuits share one or more package pins.

16. The apparatus according to claim 8, wherein said plurality of second circuits share one or more package pins.

17. The apparatus according to claim 1, wherein said physical characteristic can be altered during a sort operation and measured during class testing.

18. An apparatus comprising:
   means for storing data between a first and a second bond pad, wherein said storage means is coupled to said first bond pad in response to an enable signal; and
   means for (i) coupling said storage means to a programming or measuring device connected to said first bond pad and (ii) isolating other circuitry connected to said first bond pad from said first bond pad in response to said enable signal during a test mode.

19. The apparatus according to claim 1, wherein said physical characteristic is altered to a range of values.

20. The apparatus according to claim 1, wherein said first circuit is isolated from said first bond pad when said other circuitry is operated in a normal mode of operation.

* * * * *